US 9,172,376 B2

(12) United States Patent
Chen et al.

(10) Patent No.: US 9,172,376 B2
(45) Date of Patent: Oct. 27, 2015

(54) CONTROLLING VOLTAGE AT PAD

(71) Applicant: Taiwan Semiconductor Manufacturing Company Limited, Hsin-Chu (TW)

(72) Inventors: Yu-Ren Chen, Zhudong Township (TW); Guang-Cheng Wang, Zhubei (TW); Ming-Hsin Yu, Taiching (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/903,422

(22) Filed: May 28, 2013

(65) Prior Publication Data
US 2014/0266387 A1 Sep. 18, 2014

Related U.S. Application Data

(60) Provisional application No. 61/794,860, filed on Mar. 15, 2013.

(51) Int. Cl.
*H03L 5/00* (2006.01)
*H03K 19/0185* (2006.01)
*H03K 19/007* (2006.01)

(52) U.S. Cl.
CPC ...... *H03K 19/018521* (2013.01); *H03K 19/007* (2013.01)

(58) Field of Classification Search
CPC .............. H03K 19/018521; H03K 19/007
USPC ................................. 327/108, 112, 333
See application file for complete search history.

(56) References Cited

U.S. PATENT DOCUMENTS

| 6,031,395 | A  | * | 2/2000  | Choi et al. ............... 326/83 |
| 6,326,811 | B1 | * | 12/2001 | Coddington et al. ........ 326/83 |
| 7,009,420 | B2 | * | 3/2006  | Schafer ................... 326/30 |
| 8,461,899 | B2 | * | 6/2013  | Rana ..................... 327/333 |
| 8,610,488 | B2 | * | 12/2013 | Yu et al. ................. 327/410 |
| 8,860,497 | B1 | * | 10/2014 | Pattnayak et al. .......... 327/534 |

* cited by examiner

*Primary Examiner* — Kenneth B Wells
(74) *Attorney, Agent, or Firm* — Cooper Legal Group, LLC

(57) ABSTRACT

One or more systems and techniques for communicating a signal between a first chip and a second chip using one or more circuits are provided. If the signal corresponds to a first voltage, one or more voltages are provided to one or more locations and a capacitive load is charged using a pull-up driver that is connected to a power supply. If the signal corresponds to a second voltage, one or more voltages are provided to one or more locations and the capacitive load is discharged using a pull-down driver that is connected to ground. When the first chip is powered off, a fail-safe mode is provided by configuring a cross control circuit to generate a bias to control one or more transistors.

20 Claims, 4 Drawing Sheets

400

|   | INPUT MODE | | OUTPUT MODE | | FAIL SAFE |
| --- | --- | --- | --- | --- | --- |
|   | LOW | HIGH | LOW | HIGH |   |
| PWR | 3.3 | 3.3 | 3.3 | 3.3 | 0 |
| PAD | 0 | 3.3 | 0 | 3.3 | 3.3 |
| A | 0 | 3.3 | 0 | 3.3-Vt | 1.8 |
| B | 1.8 | 3.3 | 1.8 | 3.3-Vt | 1.8 |
| C | 1.8 | 3.3 | 1.8 | 3.3-Vt | 1.8 |
| D | 1.8 | 1.8 | 1.8 | 3.3 | 3.3 |
| F | 0 | 1.8 | 0 | 3.3-Vt | 1.8 |
| H | 1.8 | 3.3 | 1.8 | 3.3-Vt | 1.8 |
| W1 | 1.8 | 3.3 | 1.8 | 3.3 | 3.3 |
| W2 | 3.3 | 3.3 | 3.3 | 3.3 | 1.8 |
| PG | 3.3 | 3.3 | 3.3 | 1.8 | 1.8 |
| NG | 0 | 0 | 1.8 | 0 | 0 |

CONTROLLING VOLTAGE AT PAD

BACKGROUND

Some circuits are configured to couple one or more electrical components to one or more other electrical components. Such circuits are commonly found in circuitry of various electronic devices, such as personal computers and cellular phones. Such circuits are also commonly found in memory circuitry.

DESCRIPTION OF THE DRAWINGS

FIG. 4 is an illustration of at least some values of voltages that are applied to one or more locations of a circuit, according to some embodiments.

DETAILED DESCRIPTION

Figure 1:
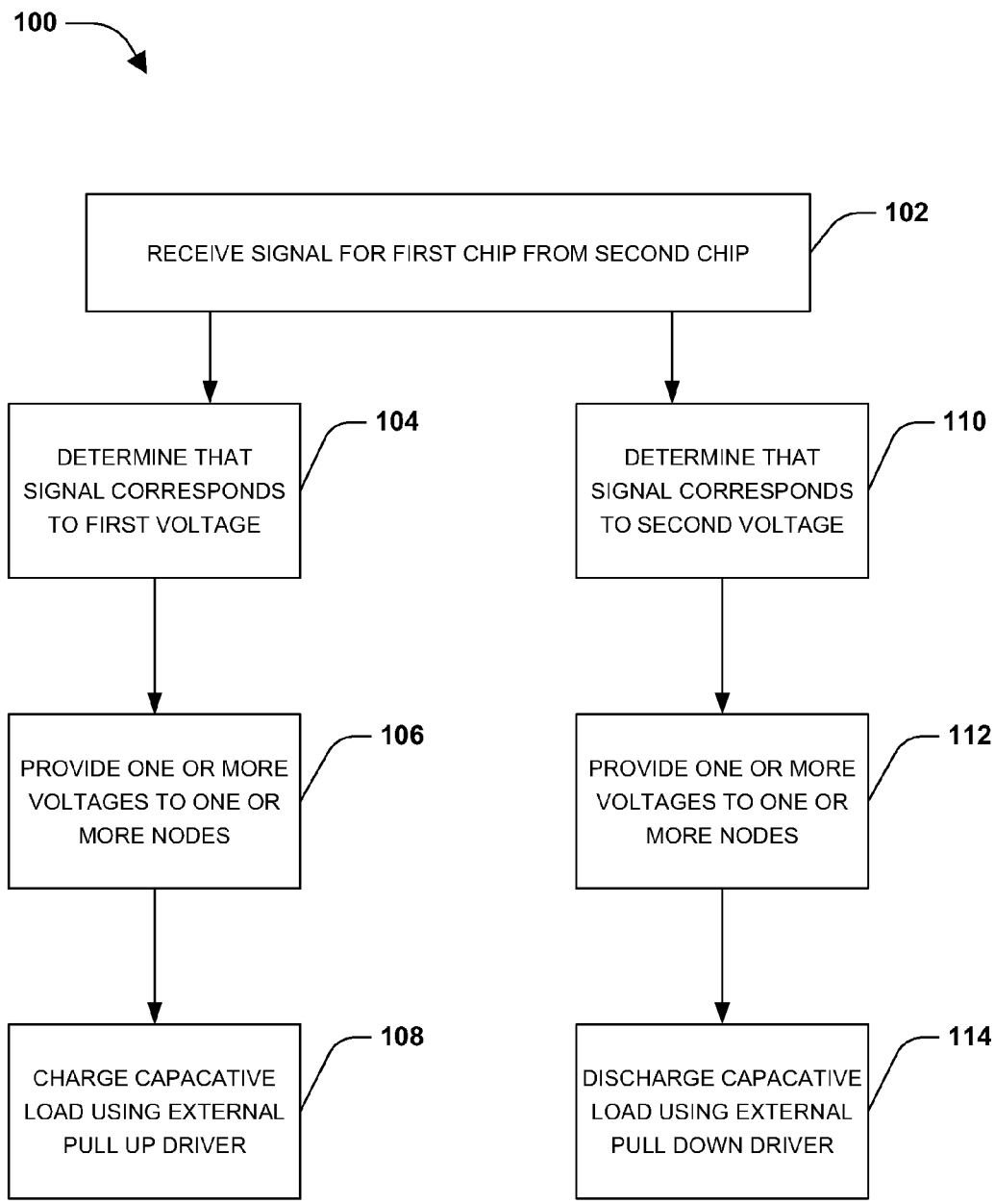
FIG. 1 is a flow diagram illustrating a method of processing an input signal, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more circuits and one or more techniques for using such circuits to facilitate signals between chips, for example, are provided herein. A circuit is connected to a first chip, and a second chip via a pad. For example, the first chip is associated with a different voltage level than the second chip. The circuit comprises a pull-up driver, a pull-down driver, and a cross-control circuit. In some embodiments, the circuit receives an input signal for the first chip from the second chip. If the input signal corresponds to a first voltage, then one or more voltages are applied to one or more locations in the circuit, and a capacitive load is charged using an external pull-up driver. If the input signal corresponds to a second voltage, such as a voltage less than the first voltage, then one or more other voltages are applied to one or more locations in the circuit, and the capacitive load is discharged using an external pull-down driver. In other embodiments, the circuit receives an output signal for the second chip from the first chip. If the output signal corresponds to a first voltage, then one or more voltages are applied to one or more locations in the circuit, and a capacitive load is charged using an internal pull-up driver. If the output signal corresponds to a second voltage, such as a voltage less than the first voltage, then one or more other voltages are applied to one or more locations in the circuit, and the capacitive load is discharged using an internal pull-down driver. In an embodiment, the circuit provides a fail-safe mode. In the fail-safe mode, where the second chip attempts to transmit a signal to the first chip and the first chip is powered off, the cross control circuit generates a bias to control one or more transistors.

Figure 3:
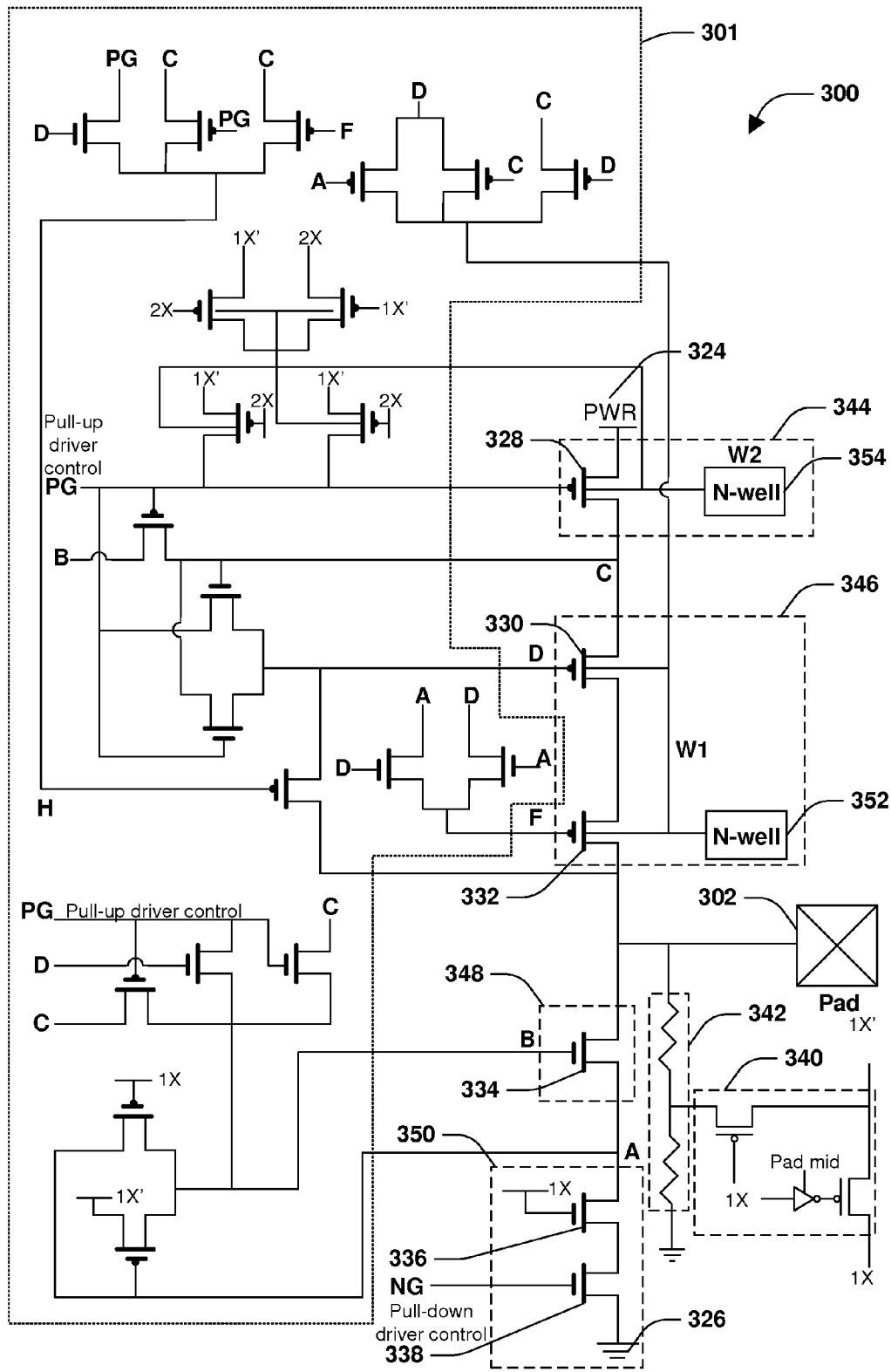
FIG. 3 is an illustration of a circuit, according to some embodiments.

A method 100 of facilitating a signal between a first chip and a second chip, according to some embodiments, is illustrated in FIG. 1, and one or more circuits used to implement such a methodology are illustrated in FIG. 3. In FIG. 4, at least some values of voltages that are applied to one or more locations of a circuit are indicated. At 102, an input signal for a first chip is received from a second chip by an input/output (I/O) interface comprising a circuit, as illustrated in example 300 of FIG. 3. In an embodiment, the input signal is received from the second chip via a pad 302.

At 104, a determination is made that the input signal corresponds to a first voltage. In some embodiments, the input signal is associated with logical high. For example, the input signal is a 3.3 V signal. At 106, one or more voltages are applied to one or more locations. In an embodiment, the one or more locations are comprised in the I/O interface comprising the circuit. Application of the one or more voltages to the one or more locations results in transmission of a logical high to the first chip. For example, a first amount of voltage is applied to A, the first amount of voltage is applied to B, the first amount of voltage is applied to C, a second amount of voltage is applied to D, the second amount of voltage is applied to F, the first amount of voltage is applied to H, the first amount of voltage is applied to W1, the first amount of voltage is applied to W2, the first amount of voltage is applied to PG, which corresponds to an external pull-up driver, and a third amount of voltage is applied to NG, which corresponds to an external pull-down driver, as illustrated in example 400 of FIG. 4. At 108, a capacitive load is charged using the external pull-up driver. In some embodiments, the first amount of voltage is greater than the second amount of voltage, and the second amount of voltage is greater than the third amount of voltage. For example, the first amount of voltage is 3.3 V, the second amount of voltage is 1.8 V, and the third amount of voltage is 0 V. In an embodiment, the external pull-up driver is connected to a power supply 324. The power supply 324 is associated with a voltage level, such as a 3.3 V level. In another embodiment, the external pull-down driver is connected to ground 326.

In some embodiments, the pad 302 may have a high voltage, such as 3.3 V. The high voltage of the pad 302 triggers the cross control circuit 301 to control net voltages of A, B, C, D, F, W1, W2, and PG.

It will be appreciated that in some embodiments, the external pull-up driver is associated with one or more transistors. In an embodiment, the one or more transistors comprise a p-type transistor, such as a p-type metal-oxide semiconductor field-effect transistor (pMOSFET). For example, in FIG. 3, transistor 328, transistor 330, and transistor 332 are pMOSFETs associated with the external pull-up driver. In other embodiments, the one or more transistors comprise an insulated gate bipolar transistor (IGBT), a bipolar junction transistor (BJT), a field-effect transistor (FET), or an n-type metal-oxide semiconductor field-effect transistor (nMOSFET), for example.

At 110, a determination is made that the input signal corresponds to a second voltage, such a voltage less than the first voltage. In some embodiments, the input signal is associated with logical low. For example, the input signal is a 0 V signal. At 112, one or more voltages are applied to one or more locations. In an embodiment, the one or more locations are comprised in the I/O interface comprising the circuit. Application of the one or more voltages to the one or more locations results in transmission of a logical low to the first chip. For example, a third amount of voltage is applied to A, a second amount of voltage is applied to B, the second amount of voltage is applied to C, the second amount of voltage is applied to D, the third amount of voltage is applied to F, the second amount of voltage is applied to H, the second amount of voltage is applied to W1, a first amount of voltage is applied to W2, the first amount of voltage is applied to PG, which corresponds to an external pull-up driver, and the third amount of voltage is applied to NG, which corresponds to an external pull-down driver, as illustrated in example 400 of FIG. 4. At 114, the capacitive load is discharged using the external pull-down driver. In some embodiments, the first amount of voltage is greater than the second amount of voltage, and the second amount of voltage is greater than the third amount of voltage. For example, the first amount of voltage is 3.3 V, the second amount of voltage is 1.8 V, and the third amount of voltage is 0 V. In an embodiment, the external pull-up driver is connected to a power supply 324. The power supply 324 is associated with a voltage level, such as a 3.3 V level. In another embodiment, the external pull-down driver is connected to ground 326.

In some embodiments, the pad 302 may have a low voltage, such as 0 V. The low voltage of the pad 302 triggers the cross control circuit 301 to control net voltages of A, B, C, D, F, W1, W2, and PG.

It will be appreciated that in some embodiments, the external pull-down driver is associated with one or more transistors. In an embodiment, the one or more transistors comprise a p-type transistor, such as a pMOSFET. In other embodiments, the one or more transistors comprise an IGBT, a BJT, a FET, or an nMOSFET, for example. For example, in FIG. 3, transistor 334, transistor 336, and transistor 338 are nMOSFETs associated with the external pull-down driver.

Figure 2:
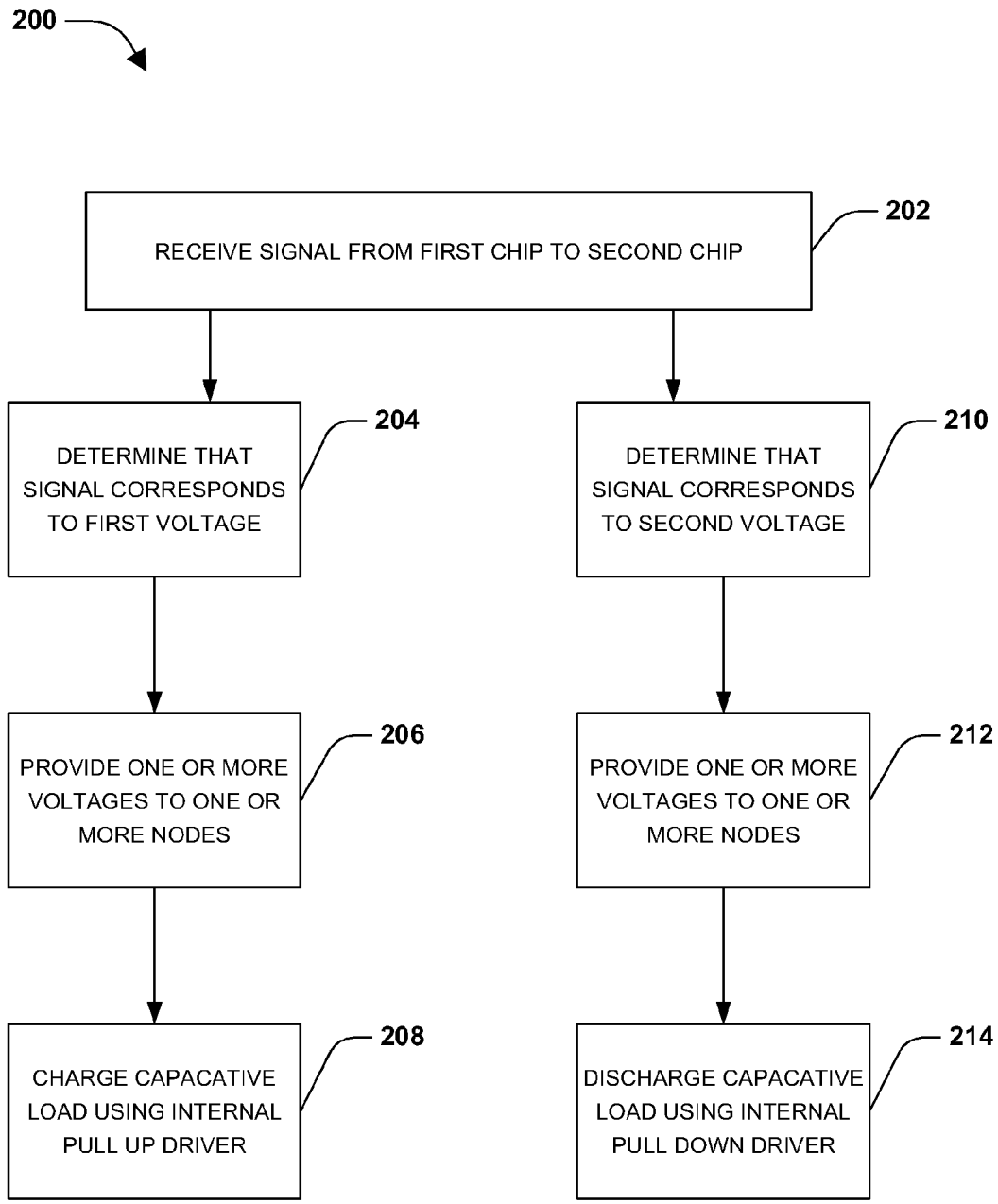
FIG. 2 is a flow diagram illustrating a method of processing an output signal, according to some embodiments.

A method 200 of facilitating a signal between a first chip and a second chip, according to some embodiments, is illustrated in FIG. 2, and one or more circuits used to implement such a methodology are illustrated in FIG. 3. In FIG. 4, at least some values of voltages that are applied to one or more locations of a circuit are indicated. At 202, an output signal for a second chip is received from a first chip by an I/O interface comprising a circuit, as illustrated in example 300 of FIG. 3. In an embodiment, the output signal is received from the first chip via a pad 302.

At 204, a determination is made that the output signal corresponds to a first voltage. In some embodiments, the output signal is associated with logical high. For example, the output signal is a 3.3 V signal. At 206, one or more voltages are applied to one or more locations. In an embodiment, the one or more locations are comprised in the I/O interface comprising the circuit. Application of the one or more voltages to the one or more locations may result in transmission of a logical high to the second chip. For example, a fourth amount of voltage is applied to A, the fourth amount of voltage is applied to B, the fourth amount of voltage is applied to C, a first amount of voltage is applied to D, the fourth amount of voltage is applied to F, the fourth amount of voltage is applied to H, the first amount of voltage is applied to W1, the first amount of voltage is applied to W2, a second amount of voltage is applied to PG, which corresponds to an internal pull-up driver, and a third amount of voltage is applied to NG, which corresponds to an internal pull-down driver, as illustrated in example 400 of FIG. 4. At 208, a capacitive load is charged using the internal pull-up driver. In some embodiments, the first amount of voltage is greater than the second amount of voltage, and the second amount of voltage is greater than the third amount of voltage. For example, the first amount of voltage is 3.3 V, the second amount of voltage is 1.8 V, the third amount of voltage is 0 V, and the fourth amount of voltage is 3.3 V minus a threshold voltage ($V_T$) of a transistor. In some embodiments, the threshold voltage may correspond to a transistor that the fourth amount of voltage is applied to. For example, a fourth amount of voltage applied to A is 3.3 V minus a threshold voltage of a first transistor corresponding to A, while a fourth amount of voltage applied to B is 3.3 minus a threshold voltage of a second transistor corresponding to B, where the first transistor corresponding to A is the same as or different than the second transistor corresponding to B. In an embodiment, the internal pull-up driver is connected to a power supply 324. The power supply 324 is associated with a voltage level, such as a 3.3 V level. In an embodiment, the internal pull-down driver is connected to ground 326.

In some embodiments, the internal pull-up driver pulls a net voltage of C to a high voltage, such as 3.3 V. The net voltage of C triggers the cross control circuit 301 to control net voltages of A, B, D, F, W1, W2, and PG. The pad 302 is then pulled to a high voltage, such as 3.3 V.

At 210, a determination is made that the output signal corresponds to a second voltage, such a voltage less than the first voltage. In some embodiments, the output signal is associated with logical low. For example, the output signal is a 0 V signal. At 212, one or more voltages are applied to one or more locations. In an embodiment, the one or more locations are comprised in the I/O interface comprising the circuit. Application of the one or more voltages to the one or more locations may result in transmission of a logical low to the second chip. For example, a third amount of voltage is applied to A, a second amount of voltage is applied to B, the second amount of voltage is applied to C, the second amount of voltage is applied to D, the third amount of voltage is applied to F, the second amount of voltage is applied to H, the second amount of voltage is applied to W1, a first amount of voltage is applied to W2, the first amount of voltage is applied to PG, which corresponds to an internal pull-up driver, and the second amount of voltage is applied to NG, which corresponds to an internal pull-down driver, as illustrated in example 400 of FIG. 4. At 214, the capacitive load is discharged using the internal pull-down driver. In some embodiments, the first amount of voltage is greater than the second amount of voltage, and the second amount of voltage is greater than the third amount of voltage. For example, the first amount of voltage is 3.3 V, the second amount of voltage is 1.8 V, and the third amount of voltage is 0 V. In an embodiment, the internal pull-up driver is connected to a power supply 324. The power supply 324 is associated with a voltage level, such as a 3.3 V level. In another embodiment, the internal pull-down driver is connected to ground 326.

In some embodiments, the internal pull-down driver pulls a net voltage of A to a low voltage, such as 0 V. The net voltage of A triggers the cross control circuit 301 to control net voltages of B, C, D, F, W1, W2, and PG. The pad 302 is then pulled to a low voltage, such as 0 V.

It may further be appreciated that in some embodiments, the first chip is associated with a different voltage level than the second chip. In an embodiment, the first chip is associated with a greater voltage level than the second chip. For example, the first chip is associated with a 3.3 V voltage level and the second chip is associated with a 1.8 V voltage level. In another embodiment, the first chip is associated with a lower voltage level than the second chip. For example, the first chip is associated with a 1.8 V voltage level and the second chip is associated with a 3.3 V voltage level. At least some of the described embodiments may allow a 3.3 V I/O interface to work with a 1.8 V process.

A system configured to provide a fail-safe mode, according to some embodiments, is illustrated at least in part in FIG. 3. The system comprises an I/O interface as illustrated by example 300, a first chip, a second chip, and a cross control circuit 301. The second chip is configured to transmit a signal for the first chip via the I/O interface. The first chip is powered off. The cross control circuit 301 is configured to generate a bias to control one or more transistors. In some embodiments, the cross control circuit 301 is configured to generate a bias in one or more nMOSFETs. For example, the one or more nMOSFETs comprise transistor 334, transistor 336, and transistor 338. In some embodiments, the cross control circuit 301 is configured to generate a bias in one or more pMOSFETs. For example, the one or more pMOSFETs comprise transistor 328, transistor 330, and transistor 332. It will be appreciated that the fail-safe mode may control leakage and improve safety when the second chip transmits the signal to the first chip while the first chip is powered off.

In an embodiment of the fail-safe mode, the signal from the second chip is a 3.3 V signal. The power supply 324 is associated with a voltage level, such as a 0 V level. In some embodiments, a second amount of voltage is applied to A, the second amount of voltage is applied to B, the second amount of voltage is applied to C, a first amount of voltage is applied to D, the second amount of voltage is applied to F, the second amount of voltage is applied to H, the first amount of voltage is applied to W1, the second amount of voltage is applied to W2, the second amount of voltage is applied to PG, which corresponds to an internal pull-up driver, and a third amount of voltage is applied to NG, which corresponds to an internal pull-down driver, as illustrated in example 400 of FIG. 4. In some embodiments, the first amount of voltage is greater than the second amount of voltage, and the second amount of voltage is greater than the third amount of voltage. For example, the first amount of voltage is 3.3 V, the second amount of voltage is 1.8 V, and the third amount of voltage is 0 V.

In an embodiment illustrated at least in part in FIG. 3, a circuit may comprise a power switch 340 and a voltage divider 342. The voltage divider 342 comprises one or more resistors, such as a resistor coupled to ground. In some embodiments, the voltage divider 342 comprises one or more other devices, such as transistors or diodes. The power switch 340 comprises a first transistor, a second transistor and an inverter. The voltage divider 342 is coupled to the first transistor of the power switch 340. For example, the voltage divider 342 is coupled to a source of the first transistor. The first transistor is coupled to the second transistor. For example, a drain of the first transistor is coupled to a source of the second transistor. The second transistor is coupled to the inverter. For example, a gate of the second transistor is coupled to the inverter. The inverter is coupled to a first voltage source. In some embodiments, the inverter is coupled to a device corresponding to a middle bias of the pad 302. The first voltage source is coupled to a gate of the first transistor. The second transistor is coupled to a second voltage source. For example, a drain of the second transistor is coupled to the second voltage source. The source of the second transistor is coupled to a third voltage source. In some embodiments, the first voltage source is configured to supply 1X, the second voltage source is configured to supply 1X, and the third voltage source is configured to supply 1X'. In an embodiment, the first voltage source and the second voltage source correspond to voltage from an external source, and the third voltage source corresponds to voltage from the power switch 340.

In some embodiments illustrated at least in part in FIG. 3, the voltage divider 342 is coupled to a pad 302. The pad 302 is coupled to an N shield 348 comprising transistor 334. For example, the pad 302 is coupled to a source of transistor 334. The N shield 348 is coupled to a pull-down driver 350 comprising transistor 336 and transistor 338. For example, a drain of transistor 334 is coupled to a source of transistor 336, and a drain of transistor 336 is coupled to a source of transistor 338. A drain of transistor 338 is coupled to ground 326. The N shield 348 is coupled to a P shield 1 346. The P shield 1 346 comprises transistor 330, transistor 332, and N-well 352. For example, the source of transistor 334 is coupled to a drain of transistor 332, a source of transistor 332 is coupled to a drain of transistor 330, and the N-well 352 is coupled to transistor 330 and transistor 332. The P shield 1 346 is coupled to a P shield 2 344. The P shield 2 344 comprises transistor 328 and N-well 354. For example, a source of transistor 330 is coupled to a drain of transistor 328, and transistor 328 is coupled to N-well 354. In an embodiment, a source of transistor 328 is coupled to a power supply 324.

In some embodiments, as illustrated in FIG. 3, transistor 328, transistor 330, transistor 332, transistor 334, transistor 336, transistor 338, N-well 354, and/or N-well 352 are connected to one or more devices. At least some of the one or more devices are comprised in a cross control circuit 301. For example, the one or more devices comprise one or more transistors. At least one of the one or more transistors is coupled to a voltage source. For example, a voltage source corresponds to a first voltage, a second voltage, or a third voltage. In an embodiment, the first voltage is indicated by 1X, the second voltage is indicated by 1X', and the third voltage is indicated by 2X. It will be appreciated that in an embodiment, the first voltage and the third voltage correspond to voltage from an external source, and the second voltage corresponds to voltage from a power switch. In some embodiments, the first voltage corresponds to 1.8 V, the second voltage corresponds to 1.8 V, and the third voltage corresponds to 3.3 V.

According to an aspect of the instant disclosure, a method for facilitating a signal between a first chip and a second chip is provided. The method comprises, if the signal corresponds to a first voltage, providing one or more voltages to one or more locations, and charging a capacitive load using an external pull-up driver that is connected to a power supply. The method further comprises, if the signal corresponds to a second voltage, providing one or more voltages to one or more locations, and discharging the capacitive load using an external pull-down driver that is connected to ground.

According to an aspect of the instant disclosure, a method for facilitating a signal between a first chip and a second chip is provided. The method comprises, if the signal corresponds to a first voltage, providing one or more voltages to one or more locations, and charging a capacitive load using an internal pull-up driver that is connected to a power supply. The method further comprises, if the signal corresponds to a second voltage, providing one or more voltages to one or more locations, and discharging the capacitive load using an internal pull-down driver that is connected to a discharge node, such as ground.

According to an aspect of the instant disclosure, a system to provide a fail-safe mode is provided. The system comprises an I/O interface, a first chip, a second chip, and a cross control circuit. The second chip is configured to transmit a signal for the first chip via the I/O interface. The first chip is powered off. The cross control circuit is configured to generate a bias to control one or more transistors.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for applying a first voltage at a pad, comprising:
  activating a pull-up driver situated between a power supply outputting the first voltage and a node to pull the node to a second voltage, the second voltage less than the first voltage by about a voltage threshold of the pull-up driver;
  triggering, responsive to the node being pulled to the second voltage, a cross control circuit to activate one or more transistors situated between the pull-up driver and the pad, comprising:
    applying the first voltage to a first gate of a first transistor of the one or more transistors; and
  pulling the pad to the first voltage responsive to activating the one or more transistors situated between the pull-up driver and the pad.

2. The method of claim 1, wherein the triggering a cross control circuit to activate one or more transistors comprises:
  applying the second voltage to a second gate of a second transistor of the one or more transistors.

3. The method of claim 2, wherein the second transistor is situated between the first transistor and the pad.

4. The method of claim 1, wherein the pull-up driver comprises one or more pMOSFETs.

5. The method of claim 1, further comprising triggering, responsive to the node being pulled to the second voltage, the cross control circuit to apply the second voltage to a second gate of a second transistor situated between the pad and a pull-down driver.

6. A method, comprising:
  responsive to determining that a first voltage is to be applied to a pad:
    activating a pull-up driver situated between a power supply outputting the first voltage and a first node to pull the first node to a second voltage;
    triggering, responsive to the first node being pulled to the second voltage, a cross control circuit to activate one or more transistors situated between the pull-up driver and the pad; and
    pulling the pad to the first voltage responsive to activating the one or more transistors situated between the pull-up driver and the pad; and
  responsive to determining that a third voltage is to be applied to the pad:
    activating a pull-down driver situated between ground and a second node to pull the second node to the third voltage;
    triggering, responsive to the second node being pulled to the third voltage, the cross control circuit to activate one or more transistors situated between the pull-down driver and the pad, comprising:
      applying a fourth voltage to a first gate of a first transistor of the one or more transistors situated between the pull-down driver and the pad; and
    pulling the pad to the third voltage responsive to activating the one or more transistors situated between the pull-down driver and the pad.

7. The method of claim 6, wherein the activating a pull-down driver comprises:
  applying the fourth voltage to one or more gates of the pull-down driver.

8. The method of claim 6, further comprising triggering, responsive to the second node being pulled to the third voltage, the cross control circuit to apply the third voltage to a gate of a first transistor of the one or more transistors situated between the pad and the pull-up driver.

9. The method of claim 6, wherein the third voltage is about 0 V and the fourth voltage is about 1.8 V.

10. The method of claim 6, wherein the pull-down driver comprises one or more nMOSFETs.

11. The method of claim 8, further comprising triggering, responsive to the second node being pulled to the third voltage, the cross control circuit to apply the third voltage to a second transistor of the one or more transistors situated between the pad and the pull-up driver.

12. The method of claim 11, wherein the first transistor of the one or more transistors situated between the pad and the pull-up driver is situated between the pad and the second transistor.

13. The method of claim 6, the second voltage less than the first voltage by about a voltage threshold of the pull-up driver.

14. The method of claim 6, the fourth voltage about one-half the first voltage.

15. The method of claim 6, further comprising triggering, responsive to the first node being pulled to the second voltage, the cross control circuit to apply the second voltage to a gate of a transistor situated between the pad and the pull-down driver.

16. A system comprising:
- a pull-up driver coupled to a power supply;
- a first n-well coupled to a body of the pull-up driver;
- a p-shield comprising a first transistor and a second transistor, wherein:
  - a first source of the first transistor is coupled to the pull-up driver;
  - a first drain of the first transistor is coupled to a second source of the second transistor; and
  - a second drain of the second transistor is coupled to a pad;
- a second n-well coupled to a first body of the first transistor and a second body of the second transistor, the second n-well different than the first n-well;
- an n-shield comprising a third transistor;
- a pull-down driver coupled to ground and to the n-shield; and
- a voltage divider coupled to the pad and configured to generate a reference voltage based upon a voltage at the pad.

17. The system of claim 16, wherein the n-shield is coupled to the pad.

18. The system of claim 16, wherein the pull-down driver comprises at least two transistors.

19. The system of claim 16, further comprising a cross control circuit configured to apply one or more voltages to at least one of the first transistor, the second transistor, or the third transistor.

20. The system of claim 19, further comprising a power switch configured to generate a half voltage level of an input signal for the cross control circuit.

* * * * *